United States Patent
Mizuhara et al.

(10) Patent No.: US 6,614,214 B2
(45) Date of Patent: Sep. 2, 2003

(54) SAMPLING ELEMENT CONTROLLED BY PHOTOCONDUCTIVE SWITCH-GENERATED SAMPLING PULSES AND SAMPLING DEVICE INCORPORATING SAME

(75) Inventors: Akira Mizuhara, Tama (JP); Tsutomu Takenaka, Hachioji (JP); Yasuhisa Kaneko, Kawasaki (JP); Norihide Yamada, Kokubunji (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/919,629

(22) Filed: Jul. 30, 2001

(65) Prior Publication Data

US 2002/0074982 A1 Jun. 20, 2002

(30) Foreign Application Priority Data

Aug. 8, 2000 (JP) ........................................ 2000-239510

(51) Int. Cl.[7] .............................................. G01R 13/14
(52) U.S. Cl. ...................................... 324/76.15; 324/96
(58) Field of Search ...................... 257/664; 324/76.36, 324/96, 166, 753, 76.15; 356/73.1; 327/91, 186

(56) References Cited

U.S. PATENT DOCUMENTS

| | | | |
|---|---|---|---|
| 4,855,696 A | 8/1989 | Tan et al. ...................... 333/20 |
| 4,956,568 A | * 9/1990 | Su et al. ...................... 327/321 |

(List continued on next page.)

FOREIGN PATENT DOCUMENTS

| | | | |
|---|---|---|---|
| WO | WO 89/07833 | 8/1989 | ......... H01L/21/203 |

OTHER PUBLICATIONS

"Gallium Arsenide (GaAs)—based photoconductive switches for pulse genneration and sampling applications in the nanosecond regime", by Bell et al. IEEE transactions on Instrumentation and Measurement, vol. 35, No. 1, Feb. 1, 1989.*

Whitely, Wesley C. et al., "50GHz Sampler Hybrid Utilizing a Small Shockline and an Internal SRD", 1991 IEEE MTT–S Digest, pp. 895–898.

Kordos, P. et al., "550 GHz Bandwidth Photodetector on Low Temperature Grown Molecular–Beam Epitaxial GaAs", Electronics Letters, 1998, vol. 34, No. 1, pp. 119–120.

Takeuchi, K. et al. "Scanning Tunnelling Optoelectronic Microscope with 2PS Time Resolution", Electronics Letters, 1996, vol. 32 No. 18, pp. 1709–1711.

*Primary Examiner*—N. Le
*Assistant Examiner*—Walter Benson
(74) *Attorney, Agent, or Firm*—Ian Hardcastle (57) ABSTRACT

The sampling element comprises a DC sampling voltage source, a threshold sampling circuit and a photoconductive switching element. The threshold sampling circuit includes a signal-under-test input, a sampling pulse input and an IF signal output, and has a sampling threshold with respect to sampling pulses received at the sampling pulse input. The photoconductive switching element is connected between the DC sampling voltage source and the sampling pulse input of the threshold sampling circuit. The sampling device comprises a DC sampling voltage source, a threshold sampling circuit, a photoconductive switching element and a light source. The threshold sampling circuit includes a signal-under-test input, a sampling pulse input and an IF signal output, and has a sampling threshold with respect to sampling pulses received at the sampling pulse input. The photoconductive switching element is connected between the DC sampling voltage source and the sampling pulse input of the threshold sampling circuit. The light source is operable to generate optical pulses and is arranged to illuminate the photoconductive switching element with the optical pulses.

23 Claims, 5 Drawing Sheets

U.S. PATENT DOCUMENTS

| | | | |
|---|---|---|---|
| 5,023,574 A | 6/1991 | Anklam et al. | 333/20 |
| 5,332,918 A | 7/1994 | Smith et al. | 257/431 |
| 5,378,939 A * | 1/1995 | Marsland et al. | 327/91 |
| 5,804,921 A * | 9/1998 | McEwan et al. | 333/20 |
| 5,844,288 A | 12/1998 | Mourou et al. | 257/21 |
| 6,384,590 B1 * | 5/2002 | Kikuchi et al. | 324/76.36 |
| 6,400,165 B1 * | 6/2002 | Knox et al. | 324/752 |
| 6,538,525 B1 * | 3/2003 | Williamson | 333/20 |

* cited by examiner

SAMPLING ELEMENT CONTROLLED BY PHOTOCONDUCTIVE SWITCH-GENERATED SAMPLING PULSES AND SAMPLING DEVICE INCORPORATING SAME

BACKGROUND OF THE INVENTION

The maximum frequency of signals in electrical and electronic devices has continued to increase in recent years. Devices that handle signals up to 100 GHz now exist. The increasing use of electro-optical devices, such as those used in optical communication and optical memory, has contributed to this increase in maximum frequency. Such advances in device performance have given rise to the need to provide a corresponding increase in the maximum frequency of apparatus used to observe and measure the waveforms of high-speed and high-frequency signal waveforms.

One way to observe the waveform of a high-speed or high-frequency electrical signal is to sample the electrical signal. Sampling the electrical signal converts the electrical signal to a lower-speed electrical signal that can be observed and measured conventionally. The broadest-band sampling oscilloscope currently commercially available has a bandwidth of only 50 GHz. Various approaches have been tried in an attempt to produce a sampling oscilloscope with a broader bandwidth. Some of the proposed approaches, and their drawbacks, will be described next.

One approach is described by K. Takeuchi and A. Mizuhara in *Scanning Tunneling Optoelectronic Microscope with 2 Ps Time Resolution*, 32 ELEC. LETT., 1709–1711 (1996 August). This approach uses a photoconductive switch as a sampling element. A photoconductive switch is controlled by light generated by a commercial pulsed light source having a full width at half maximum of about 100 fs. The electrical signal-under-test is sampled by passing it through the photoconductive switch. The photoconductive switch easily provides a response having a full width at half maximum of about 2 ps. A sampling circuit that uses such a photoconductive switch as its sampling element can respond with a time resolution of 2 ps, which corresponds to a frequency of about 175 GHz.

Photoconductive switches tend to have a dynamic switching characteristic that exhibits a tailing response in its turn-off characteristic, as will be described in more detail below. As a result of this, a sampling device that incorporates a photoconductive switch as its sampling element has frequency characteristics that are not flat at low frequencies, and the response of the sampling device gradually decreases with increasing frequency. Such characteristics are not desirable in a sampling device for high-frequency and high-speed electrical signals.

Another approach is described by Wesley C. Whitely et al. in *50 GHz Sampler Hybrid Utilizing a Small Shockline and an Internal SRD*, AA-6 IEEE MTT-S DIGEST, 895–898 (1991). In this approach, a high-speed step signal is generated by a step recovery diode (SRD). The fall-time of the high-speed step signal is reduced by passing the signal through a non-linear transmission line (NLTL). After passing through the NLTL, the high-speed step signal is applied as a sampling pulse to a diode sampling bridge.

Figure 1:
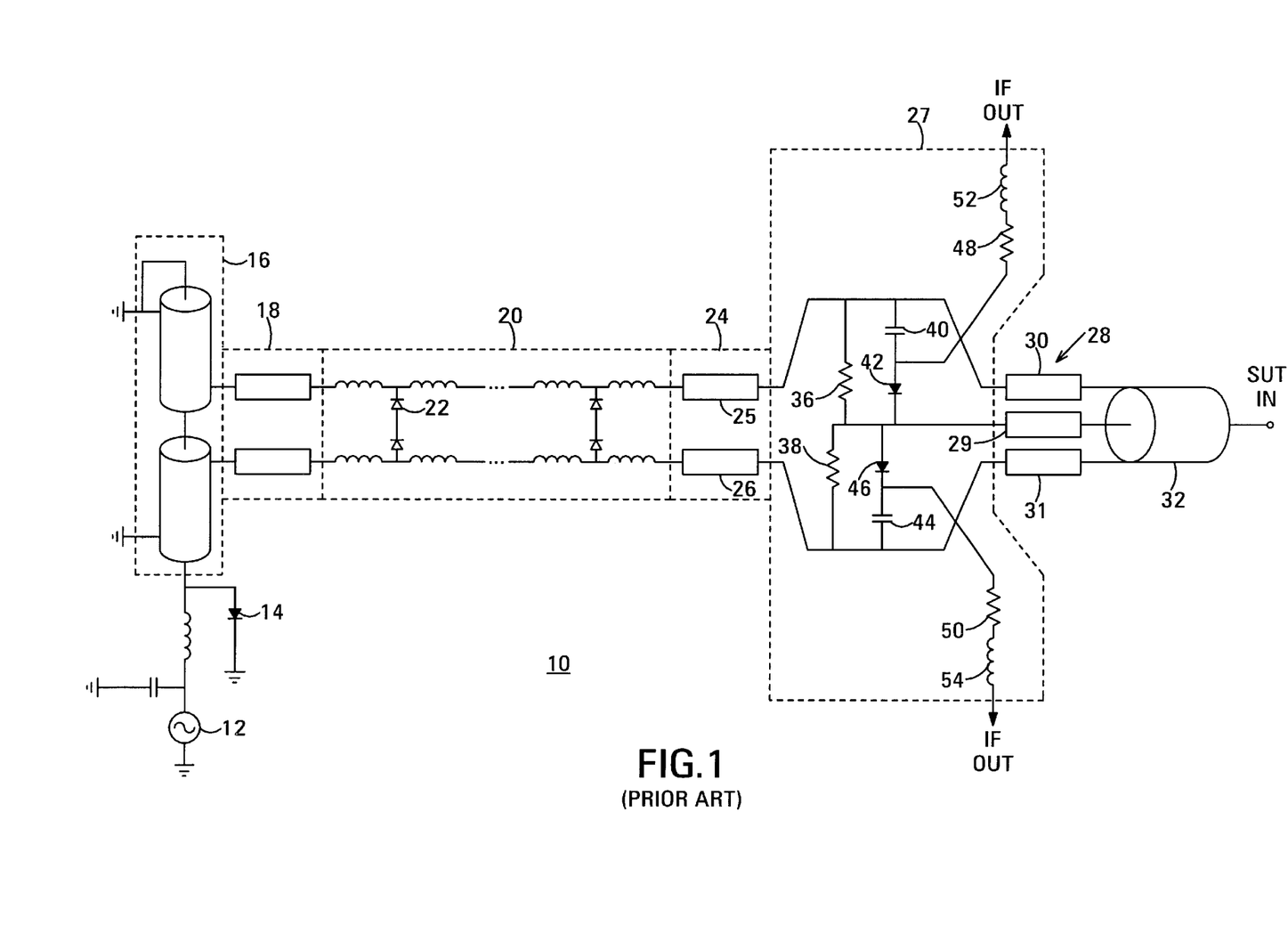
FIG. 1 is a simplified circuit diagram of a sampling device that uses sampling pulses generated by a step recovery diode and a non-linear transmission line.

FIG. 1 is a block diagram of the sampling circuit 10 disclosed by Whitely et al. In the sampling circuit 10, the output of the local oscillator 12 is applied to a step recovery diode 14. The step signal generated by the step recovery diode is converted into a balanced step signal by the microstrip balun 16. The balanced step signal is fed by the coplanar line 18 to the non-linear transmission line 20. The non-linear transmission line is composed of a high-impedance transmission line with shunt varactor diodes placed at intervals along its length. The non-linear transmission line can be regarded as having N identical stages. Each stage contains a varactor diode centered in a length d of transmission line. An exemplary one of the varactor diodes is shown at 22. Passing the step signal through the NLTL decreases the fall time of step signal generated by the step-recovery diode 14.

The output of the NLTL 20 is connected by the coplanar lines 24, composed of the striplines 25 and 26, to the sampling signal inputs of the sampling chip 27. The step signal output by the NLTL propagates through the coplanar stripline 28, composed of the signal line 29 and the ground lines 30 and 31. After passing through the coplanar stripline 29, the step signal is reflected by the short-circuit at the input port 32 to form a sampling pulse.

The hold capacitor 40 is connected in series with the sampling diode 42, and the termination resistor 36 is connected in parallel with the series combination. The resulting series/parallel combination is connected between the signal line 29 and the junction of the strip line 25 and the ground line 30. The hold capacitor 44 is connected in series with the sampling diode 46, and the termination resistor 38 is connected in parallel with the series combination. The resulting series/parallel combination is connected between the signal line 29 and the junction of the strip line 26 and the ground line 31.

The signal-under-test SUT is received at the input port 32 and is fed to the connection point of the sampling diodes 42 and 46 by the signal line 29. The signal-under-test is sampled by the sampling diodes. The samples are held by the hold capacitors 40 and 44. The IF signal composed of the samples of the signal-under-test is coupled from the junction of the hold capacitor 40 and the sampling diode 42 and from the junction of the hold capacitor 44 and the sampling diode 46 via the hold resistors 48 and 50 and the low-pass circuitry 52 and 54. The IF signal is processed by a suitable IF amplifier (not shown).

The non-linear transmission line 20 is composed of at least ten stages each composed of a high impedance transmission line and a shunt varactor diode. The example described by Whitely et al. had 27 stages. The NLTL therefore imposes a large insertion loss on the high-speed step signal, which makes it difficult to generate large-amplitude sampling pulses for application to the sampling diodes 42 and 46. This causes the sampling device 10 to generate the IF signal with an insufficient signal-to-noise ratio for some applications. Moreover, the non-linear circuit elements included in the NLTL can cause multiple reflections in the NLTL. The reflected signals appear superimposed on the high-speed step signal and increase the rise- and fall-times of the sampling pulses. As a result, the narrowest sampling pulse achieved had a full width at half maximum of about 10 ps. This limits the maximum frequency of the signal-under-test that can be sampled by the sampling device 10.

A sampling device in which an air gap between the signal line and the substrate is introduced into the non-linear transmission line 20 is disclosed by S. T. Allen in *Schottky Diode Integrated Circuits for Sub-Millimeter-Wave Application*, PH.D. DISSERTATION, UNIVERSITY OF CALIFORNIA, SANTA BARBARA (1994 June). The air gap reduces the insertion loss and enables the sampling device to sample a signal-under-test with a maximum frequency as high as 725 GHz. Thus, the sampling device can sample a signal-under-test with a higher maximum frequency, but its complex structure results in a high manufacturing cost.

Accordingly, what is needed is a way to generate very short electrical sampling pulses with fast rise- and fall-times, and to generate such sampling pulses at low cost. What is also needed is to provide a sampling device that uses such sampling pulses.

SUMMARY OF THE INVENTION

The invention provides a sampling element that comprises a DC sampling voltage source, a threshold sampling circuit and a photoconductive switching element. The threshold sampling circuit includes a signal-under-test input, a sampling pulse input and an IF signal output, and has a sampling threshold with respect to sampling pulses received at the sampling pulse input. The photoconductive switching element is connected between the DC sampling voltage source and the sampling pulse input of the threshold sampling circuit.

The invention also provides a sampling device that comprises a DC sampling voltage source, a threshold sampling circuit, a photoconductive switching element and a light source. The threshold sampling circuit includes a signal-under-test input, a sampling pulse input and an IF signal output, and has a sampling threshold with respect to sampling pulses received at the sampling pulse input. The photoconductive switch is connected between the DC sampling voltage source and the sampling pulse input of the threshold sampling circuit. The light source is operable to generate optical pulses and is arranged to illuminate the photoconductive switching element with the optical pulses.

The sampling pulse input of the threshold sampling circuit may include a first sampling pulse input and a second sampling pulse input, the DC sampling voltage source may include a first output terminal and a second output terminal, and the photoconductive switching element may includes a first photoconductive switch and a second photoconductive switch. The first photoconductive switch is connected between the first output terminal and the first sampling pulse input, and the second photoconductive switch is connected between the second output terminal and the second sampling pulse input. In this embodiment, the DC sampling voltage source may include a first DC generator and a second DC generator, each of which as a positive output terminal and a negative output terminal. The positive and negative output terminals of the first DC generator are respectively connected to the first output terminal and to ground. The positive and negative output terminals of the second DC generator are respectively connected to ground and to the second output terminal.

The sampling pulse input of the threshold sampling circuit may include a first sampling pulse input and a second sampling pulse input, the photoconductive switching element may include no more than one photoconductive switch that comprises an input connected to the DC sampling voltage source and that additionally comprises an output, and the sampling element may additionally comprise a first stripline and a second stripline disposed adjacent and substantially parallel to one another. A first portion of the first stripline is connected to the output of the photoconductive switch. A second portion of the first stripline, different from the first portion, is connected to the first sampling pulse input. A portion of the second stripline is connected to the second sampling pulse input.

The photoconductive switching element has a dynamic switching characteristic that exhibits a tailing response below a tailing threshold, and the sampling threshold of the threshold sampling circuit is greater than the tailing threshold.

The threshold sampling circuit may include a threshold switching element having an intrinsic threshold voltage that defines the sampling threshold of the threshold sampling circuit and that is greater than the tailing threshold. The switching element may additionally comprise a reverse bias voltage source that is connected to the threshold sampling circuit and that operates to increase the sampling threshold of the threshold sampling circuit to a value greater than the intrinsic threshold voltage of the threshold switching element.

The sampling element may additionally comprise a reverse bias voltage source that is connected to the threshold sampling circuit and that operates to set the sampling threshold, at least in part, to be greater than the tailing threshold.

The sampling element may additionally comprise a controller connected to the DC sampling voltage source, a reverse bias voltage source and a controller connected to the reverse bias source. The controller connected to the DC sampling source operates to control the sampling voltage. The reverse bias source is connected to the threshold sampling circuit and operates to define the sampling threshold, at least in part. The controller connected to the reverse bias voltage source operates to control the reverse bias voltage source to set the sampling threshold to be greater than the tailing threshold.

The photoconductive switching element generates high-speed electrical pulses from the sampling voltage supplied by the DC sampling voltage. The high-speed electrical pulses are supplied as sampling pulses to the threshold sampling circuit. In response to short optical pulses generated by a laser, the photoconductive switching element generates sampling pulses potentially suitable for sampling high-frequency electrical signals. However, a photoconductive switching element typically has a dynamic switching characteristic that exhibits a tailing response. Such photoconductive switching elements are generally regarded in the art as being unsuitable for generating sampling pulses to control a sampling circuit because they do not allow the sampling circuit to turn completely OFF between successive sampling pulses. This impairs the accuracy of the samples generated by the sampling circuit.

The invention overcomes this shortcoming of photoconductive switching elements, and enables the substantial sampling pulse generating advantages of photoconductive switching elements to be realized by using a threshold sampling circuit as the sampling circuit. By setting the sampling threshold of the threshold sampling circuit to be greater than the tailing threshold of the sampling pulses generated by the photoconductive switching element, the ill effects of the tailing response on the sampling performance can be substantially eliminated.

The invention provides a sampling element, and a sampling device that incorporates the sampling element, that have a flat frequency response at low frequencies. Moreover, the sampling element and sampling device are capable of sampling a signal-under-test with a higher maximum frequency than a diode sampling bridge circuit driven by sampling pulses generated by a step-recovery diode. Moreover, the sampling element and sampling device according to the invention generate a higher-level IF signal that has a higher signal-to-noise ratio than can be achieved by a diode sampling bridge circuit driven by sampling pulses generated by a non-linear transmission line.

The sampling element and a sampling device according to the invention provide a low-cost way to measure a signal-under-test having a very high maximum frequency and to perform such measurements with a high time resolution, and with a flat frequency response.

DETAILED DESCRIPTION OF THE INVENTION

Figure 2:
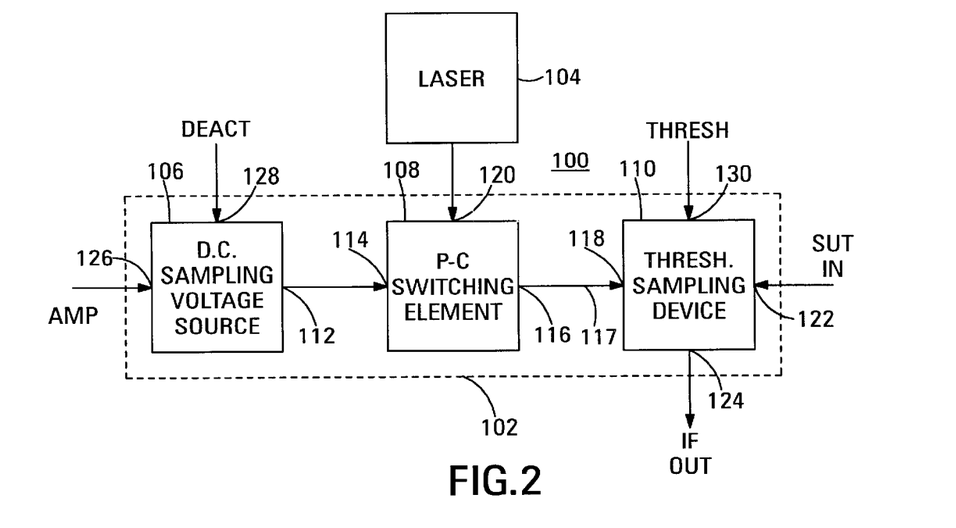
FIG. 2 is a block diagram of a sampling device according to the invention.

FIG. 2 is a simplified block diagram of the sampling device 100 according to the invention. The sampling device is composed of the sampling element 102 and the laser 104. The sampling element is composed of the DC sampling voltage source 106, the threshold sampling circuit 110 and the photoconductive switching element 108 interposed between the DC sampling voltage source and the threshold sampling circuit. The output 112 of the DC sampling voltage source is connected to the input 114 of the photoconductive switching element 108. The output 116 of the photoconductive switching element is connected to the sampling pulse input 118 of the threshold sampling circuit 110.

The photoconductive switching element 108 includes at least one photoconductive switch (not shown), as will be described in detail below. The photoconductive switching element additionally includes the optical input 120 via which it receives optical pulses from the laser 104. The photoconductive switching element generates electrical sampling pulses in response to the optical pulses. The sampling pulses have an amplitude substantially determined by the sampling voltage generated by the DC sampling voltage source 106 and a duration and repetition rate defined by the optical pulses. The photoconductive switching element supplies the sampling pulses to the sampling pulse input 118 of the threshold sampling circuit 110.

The threshold sampling circuit 110 additionally includes the signal input 122 via which it receives the signal-under-test SUT, and the IF output 124 to which it delivers an IF signal composed of the samples of the signal-under-test. The threshold sampling circuit generates the samples in response to the sampling pulses received at the sampling pulse input 118. The threshold sampling circuit has a sampling threshold with respect to sampling pulses. The threshold sampling circuit starts generating a sample of the signal-under-test only when the level of each sampling pulse exceeds the sampling threshold, and stops generating the sample of the signal-under-test when the level of the sampling pulse falls below the sampling threshold. The structure and operation of an exemplary threshold sampling circuit will be described below. Other types of threshold sampling circuits suitable for use in the sampling device 100 are known in the art and may be used instead of the example shown.

The sampling voltage generated by the DC sampling voltage source 106 substantially defines the amplitude of the sampling pulses generated by the photoconductive switching element 108. The sampling voltage may be internally defined within the DC sampling voltage source 106. Alternatively, the sampling voltage may be defined externally of the DC sampling voltage source. For example, the DC sampling voltage source may include a digital-to-analog converter or an analog voltage source capable of generating the sampling voltage at a level defined by the digital or analog amplitude control signal AMP supplied to the amplitude control input 126. An analog amplitude control signal may be provided by a variable resistor connected to a suitable reference voltage source, for example. The amplitude control signal sets the sampling voltage generated by the DC sampling voltage source, and, hence, the amplitude of the sampling pulses generated by the photoconductive switching element 108.

Power consumption of the sampling device 100 may be reduced by additionally providing the DC sampling voltage source 106 with the deactivation input 128. A deactivation control signal DEACT is fed to the deactivation input during periods when the sampling device is not being used to sample the signal-under-test to switch the DC sampling voltage source OFF and to reduce power consumption. Alternatively, the deactivation input may be omitted and a deactivation control signal may be supplied to the amplitude control input 126 in addition to the amplitude control signal AMP. As a further alternative, the amplitude control signal fed to the amplitude control input 106 may be configured to cause the DC sampling voltage source to generate a sampling voltage of zero when the sampling device is not being used to sample the signal-under-test.

The photoconductive switching element 108 and the threshold sampling circuit 110 are connected to each other by the transmission line 117, or by another suitable connection that enables the sampling pulses generated by the photoconductive switching element to remain narrow in width, fast in rise- and fall-time and large in amplitude when they are received at the sampling pulse input 118 of the threshold sampling circuit.

The photoconductive switching element 108 includes at least one photoconductive switch (not shown). Each photoconductive switch is composed of a semiconductor structure having a pair interdigitated electrodes located on its major surface. The electrodes are separated from one another by a gap. The portion of the major surface of the semiconductor structure exposed by the gap between the electrodes is irradiated with the optical pulses generated by the laser 104. Each optical pulse sets the photoconductive switch to its ON state in which the resistance between its electrodes is low. At the end of the optical pulse, the photoconductive switch changes towards its OFF state. In the OFF state of the photoconductive switching element, the resistance between its electrodes is high. In photoconductive switches used in the photoconductive switching element 110, the terms low and high are relative to the characteristic impedance of the transmission line 117.

Figure 3A:
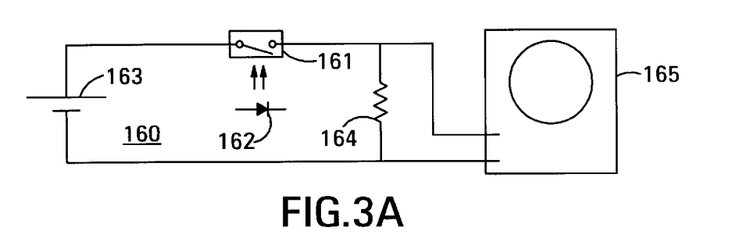
FIG. 3A is a block diagram of a test arrangement for demonstrating the dynamic switching characteristics of a photoconductive switch.

FIG. 3A shows a test arrangement 160 suitable for demonstrating the dynamic switching characteristic of the typical photoconductive switch 161 in response to optical pulses generated by the laser 162. The photoconductive switch 161 is connected in series between the DC power supply 163 and the load 164. The input of the oscilloscope 165 is connected in parallel with the load. The time base of the oscilloscope is triggered by the activation signal of the laser. The dynamic switching characteristics of the photoconductive switch 161 are observed using the oscilloscope.

Figure 3B:
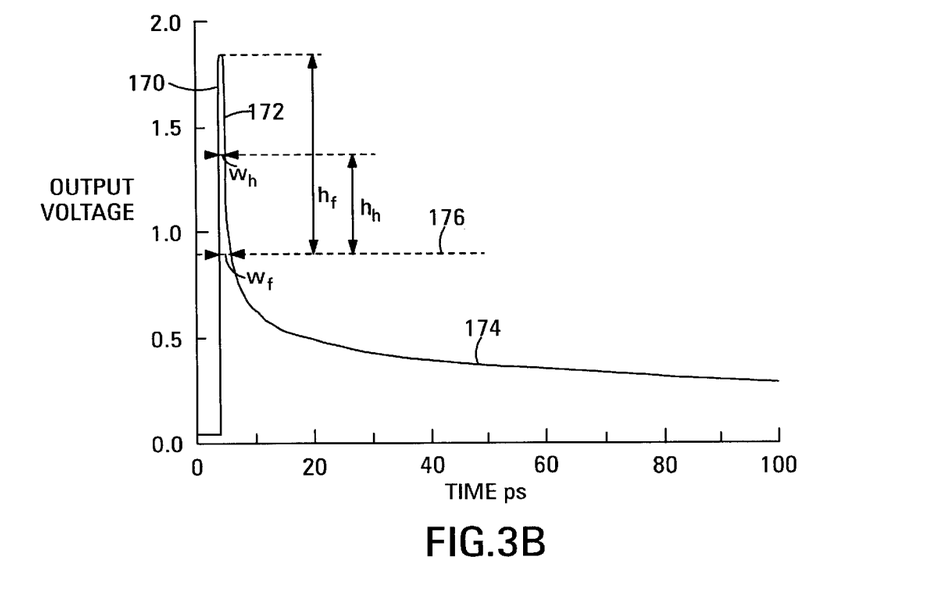
FIG. 3B is a graph showing the dynamic switching characteristic of a typical photoconductive switch.

FIG. 3B is a graph showing the changes in the voltage across the load 164 in response to a single optical pulse received by the photoconductive switch 161 from the laser 162. In response to the optical pulse, the photoconductive switch rapidly switches ON, and the voltage across the load rises rapidly, as shown at 170, to a level close to the voltage generated by the DC power supply 163.

At the end of the optical pulse, the photoconductive switch 161 rapidly turns part-way OFF. This causes an initial, rapid fall in the voltage across the load 164, as shown at 172 in FIG. 3B. After the initial rapid rise in the resistance of the photoconductive switch, the resistance continues to increase, but substantially more slowly than the initial rate of increase. This causes the voltage across the load to fall further, but much more slowly, as shown at 174. The portion 174 of the dynamic switching characteristic shown in FIG. 3B exhibits what will be called a tailing response in this disclosure.

Incorporating one or more photoconductive switches whose dynamic switching characteristic is shown in FIG. 3B into the photoconductive switching element 108 causes the photoconductive switching element to have a dynamic switching characteristic that exhibits a tailing response similar to that shown. The duration of the tailing response 174 is typically long compared with the full width half maximum duration of the optical pulses output by the laser 104. The tailing response can result in the signal applied to the sampling pulse input 118 of the threshold sampling circuit 110 not falling to zero between consecutive sampling pulses. In response to such a signal, a conventional sampling circuit would not turn fully OFF between consecutive sampling pulses, the IF signal generated by such conventional sampling circuit would not have a flat low-frequency response. As a result, the accuracy of measurements performed using the IF signal would be impaired. This problem is described by P. Kordos et al. in *550 GHz Bandwidth Photodetector on Low-temperature Grown Molecular-beam Epitaxial LT-GaAs*, 34 ELEC. LETT. 119–120 (Jan. 8, 1998) and K. Takeuchi and A. Mizuhara in *Scanning Tunneling Optoelectronic Microscope with 2 Ps Time Resolution*, 32 ELEC. LETT., 1709–1711 (1996 August).

To overcome the problem just described, the invention assigns a tailing threshold to the photoconductive switching element 108, and incorporates into the switching device 100 according to the invention the threshold sampling circuit 110 having a sampling threshold that is higher than the tailing threshold of the photoconductive switching element. The tailing threshold is the voltage level 176 shown in FIG. 3B at which the effect of the tailing response on the width of the sampling pulse is relatively small. For example, the tailing threshold may be defined as the level at which the full width of the pulse is a predetermined multiple of the full-width half maximum of the portion of the sampling pulse above the level. Thus, in FIG. 3B, in which the full width of the pulse at the tailing threshold 176 is $w_f$, the height of the portion of the sampling pulse above the tailing threshold is $h_f$, the width of the pulse at the height $h_h$ ($h_h = h_f/2$) is $w_h$, the tailing threshold is defined as the level at which $w_f = m \cdot w_h$, where m is the predetermined multiplier. The value of the multiplier may be chosen in accordance with the sampling accuracy desired, a lower value of m giving a greater accuracy. A multiplier need not be an integer.

In voltage terms, the tailing threshold of the photoconductive switching element 108 depends in part on the peak amplitude of the sampling pulse. Thus, in embodiments of the sampling device 100 in which the sampling voltage generated by the DC sampling voltage source is adjustable, adjusting the sampling voltage results in a corresponding change in the tailing threshold of the sampling pulses.

As noted above, the threshold sampling circuit 110 has a sampling threshold. The threshold sampling device does not begin to sample the signal-under-test until the sampling pulse exceeds its sampling threshold, and stops sampling the signal-under-test when the sampling pulse falls below its sampling threshold. The sampling threshold of the threshold sampling circuit is set in relation to the tailing threshold of the sampling pulses. For example, the sampling threshold of the threshold sampling circuit may be set to a level greater than the tailing threshold indicated by the line 176 in FIG. 3B. With the sampling threshold set at this level, the threshold sampling circuit samples the signal-under-test for a time that corresponds only to the non-tailing portion (170 and 172) of the dynamic switching characteristic of the photoconductive switching element. Acceptable results may also be obtained with the sampling threshold set equal to the tailing threshold, or even below the tailing threshold. Whether or not acceptable results are obtained depends on the sampling accuracy required and how conservatively the tailing threshold is defined. In the example described above, a low value of the multiplier m defines the tailing threshold more conservatively.

Some embodiments of the threshold sampling device 110 may start sampling the signal-under-test at a first sampling threshold and stop sampling the signal-under-test at a second sampling threshold. When such embodiments are used, the above remarks refer to the second sampling threshold.

The threshold sampling circuit 110 includes a threshold switching element (not shown) such as two-diode sampling bridge, a four-diode sampling bridge, a field-effect transistor or a bipolar transistor. If the portion of the sampling circuit 100 that includes the threshold sampling circuit 110 is fabricated in an integrated circuit, then the integration process may be taken into account when choosing the appropriate threshold switching element. Another factor that may be taken into account is the maximum frequency of signal-under-test. The examples of the threshold switching element are listed above in a descending order of maximum speed.

The threshold switching element may have an intrinsic threshold voltage that defines the sampling threshold of the threshold sampling circuit 110. Alternatively, the threshold sampling device may have no intrinsic sampling threshold, and the sampling threshold of the threshold sampling circuit may be defined by an external reverse bias voltage source connected to the reverse bias voltage input 130. As a further alternative, the threshold switching element may have an intrinsic sampling threshold, and the sampling threshold of the threshold sampling circuit may be defined by a combination of the intrinsic threshold of the threshold switching element and a threshold defined an external reverse bias voltage source.

Sampling diodes for use at millimeter-wave frequencies are currently available and are suitable for use as the threshold switching element of the threshold sampling circuit 110. Suitable sampling diodes are described in U.S. Pat. No. 4,956,586, for example, the disclosure of which is incorporated herein by reference. Such sampling diodes have an intrinsic threshold voltage that, in many applications, is sufficiently high to eliminate the effect of the tailing response of the photoconductive switching element 108 on the sampling performance. An embodiment of the threshold sampling circuit 110 incorporating such sampling diodes does not need an external reverse bias voltage source to define its sampling threshold. In this case, the circuit configuration of the threshold sampling circuit is quite simple.

A sampling threshold greater than the intrinsic threshold voltage of the sampling diodes may be required, for example, when the amplitude of the sampling pulses is increased to reduce the ON resistance of the sampling diodes, and the increased amplitude of the sampling pulses increases the tailing threshold to a level greater than the intrinsic threshold voltage of the sampling diodes. When the threshold sampling circuit 110 is required to have a sampling threshold greater than the intrinsic threshold voltage of the sampling diodes, an external reverse bias voltage may be provided to the threshold sampling circuit by the reverse bias voltage input 130. The external reverse bias voltage increases the sampling threshold of the threshold sampling circuit to a value greater than the intrinsic threshold voltage of the sampling diodes.

Figures 4A, 4B, 4C:
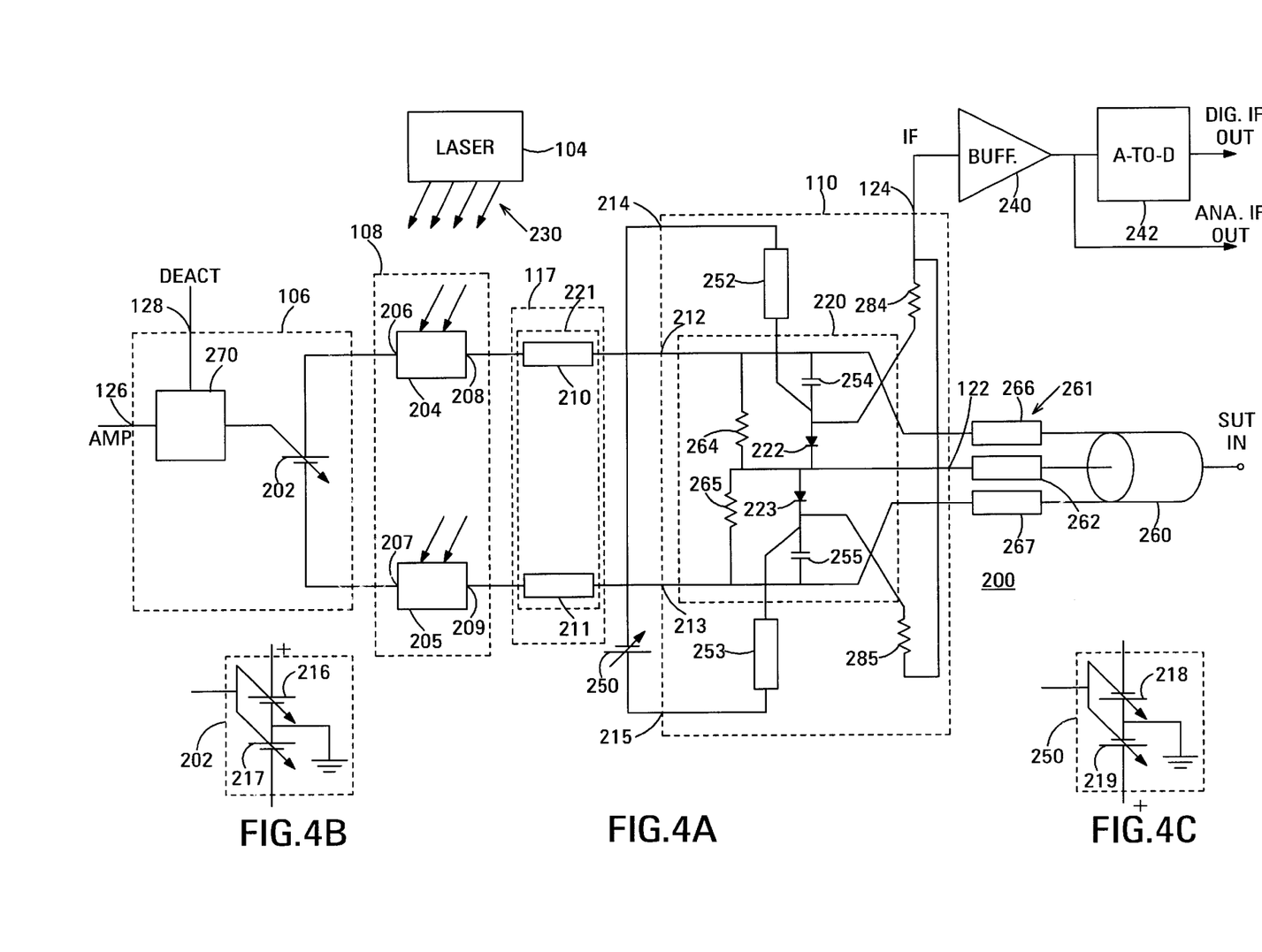
FIG. 4A is a simplified circuit diagram of a first embodiment of a sampling device according to the invention.
FIG. 4B is a circuit diagram shown an alternative arrangement of the DC sampling voltage source of the embodiment shown in FIG. 4A.
FIG. 4C is a circuit diagram shown an alternative arrangement of the reverse bias source of the embodiment shown in FIG. 4A.

FIG. 4A is a simplified circuit diagram of a first embodiment 200 of a sampling device according to the invention. In this embodiment, the photoconductive switching element 108 is composed of two photoconductive switches. Elements of the sampling device 200 that correspond to elements of the sampling device 100 shown in FIG. 2 are indicated by the same reference numerals and will not be described again here.

In the sampling device 200, the DC sampling voltage source 106 is composed of the DC generator 202 and the controller 270, and the photoconductive switching element 108 is composed of the photoconductive switches 204 and 205. The positive output terminal of the DC generator 202 is connected to the input 206 of the photoconductive switch 204, and the negative output terminal of the DC generator 202 is connected to the input 207 of the photoconductive switch 205.

The transmission line 117 is composed of the stripline 210 and the stripline 211 disposed adjacent and substantially parallel to one another. The output 208 of the photoconductive switch 204 to one end of the stripline 210. The sampling pulse input 212 of the threshold sampling circuit 110 is connected to the other end of the stripline 210. The output 209 of the photoconductive switch 205 is connected to the end of the stripline 211 corresponding to the end of the stripline 210 to which the output of the photoconductive switch 204 is connected. The sampling pulse input 213 of the threshold sampling circuit is connected to the other end of the stripline 211.

The signal-under-test SUT is received at the coaxial input connector 260. The input connector is connected to the input 122 of the threshold sampling circuit 110 by the high frequency waveguide 261. In the example shown, the high frequency waveguide is a coplanar stripline composed of the signal line 262 and the ground lines 266 and 267. The waveguide 261 maintains the balance, and, hence, the quality, of the signal-under-test presented to the input of the threshold sampling circuit 110.

The threshold sampling circuit 110 is composed of the hold capacitor 254 connected in series with the sampling diode 222 and the termination resistor 264 connected in parallel with them, and the hold capacitor 255 connected in series with the sampling diode 223 and the termination resistor 265 connected in parallel with them. In the series circuits, the anode of the sampling diode 222 is connected to the hold capacitor 254 and the cathode of the sampling diode 223 is connected to the hold capacitor 255.

One terminal of the above-described serial/parallel arrangement of the hold capacitor 254, the sampling diode 222 and the termination resistor 264 is connected to the sampling pulse input 212 and to the end of the ground line 266 remote from the input connector 260. The other terminal of the arrangement is connected to the end of the signal line 262 remote from the input connector. One terminal of the above-described serial/parallel combination of the hold capacitor 255, the sampling diode 223 and the termination resistor 265 is connected to the sampling pulse input 213 and to the end of the ground line 267 remote from the input connector. The other terminal is connected to the end of the signal line 262 remote from the input connector. With the arrangement just described, the anode of the sampling diode 222 is grounded through the hold capacitor 254 to the ground line 266 and the stripline 210, and the cathode of the sampling diode 223 is grounded through the hold capacitor 255 to the ground line 267 and the stripline 211.

The anode of the sampling diode 222 is connected to the cathode of the sampling diode 223 by the resistor 284 connected in series with the resistor 285. The junction of the resistors 284 and 285 provides the IF output 124 of the threshold sampling circuit 110, and is connected to the input of the buffer amplifier 240. The buffer amplifier buffers, and may additionally amplify, the IF signal composed of the samples of the signal-under-test generated by the threshold sampling circuit 110. The output of the buffer amplifier 240 is the analog IF output signal. FIG. 4A also shows the optional analog-to-digital converter 242 connected to the output of the buffer amplifier. The analog-to-digital converter 242 can be used, if desired, to convert the analog IF signal to a digital IF output signal capable of being subjected to digital signal processing.

The sampling diodes 222 and 223 preferably have matched characteristics and are located adjacent one another. The sampling diodes collectively form the terminated diode sampling bridge 220, which is known in the art. Currently-available sampling diodes for millimeter-wave signals, such as the diodes described in the above-mentioned U.S. Pat. No. 4,956,568, can be used as the sampling diodes. The node between the cathode of the sampling diode 222 and the anode of the sampling diode 223 provides the signal input of the terminated diode sampling bridge 220. The signal line 262 feeds the signal-under-test SUT to the signal input of the terminated diode sampling bridge. The sampling pulse inputs 212 and 213 provide the strobe inputs of the terminated diode sampling bridge, and the node between the resistors 284 and 285 provides the output of the terminated diode sampling bridge.

FIG. 4A additionally shows the optional reverse bias voltage source 250 connected to the threshold sampling circuit 110. The negative output terminal of the reverse bias voltage source is connected to the reverse bias voltage input 214 of the threshold sampling circuit and the positive output terminal of the reverse bias voltage source is connected to the reverse bias voltage input 215 of the threshold sampling circuit.

The reverse bias voltage input 214 is connected to one end of the reverse bias input line 252, and the other end of the reverse bias input line 252 is connected to the anode of the sampling diode 222. The reverse bias voltage input 215 is connected to one end of the reverse bias input line 253, and the other end of the reverse bias input line 253 is connected to the cathode of the sampling diode 223. The sampling device 200 includes the reverse bias voltage source in applications in which the amplitude of the sampling pulses is such that the tailing threshold of the sampling pulses exceeds the intrinsic threshold voltage of the sampling diodes 222 and 223. The reverse bias voltage applied to the sampling diodes by the reverse bias voltage source increases the sampling threshold of the threshold sampling circuit to a value greater than the tailing threshold of the sampling pulses. Applying a reverse bias voltage using the reverse bias voltage source can also prevent an increase in the noise level or mis-sampling caused by spurious signals resulting from reflection of the sampling pulses.

The impedance of the reverse bias input lines 252 and 253 is substantially greater than that of the terminated diode sampling bridge 220 to ensure that the full amplitude of the sampling pulses is applied to the terminated diode sampling bridge even when the reverse bias voltage source 250 has a low output impedance. The reverse bias voltage source may generate an internally-defined DC voltage as the reverse bias voltage. Alternatively, the reverse bias voltage source may generate an externally-defined DC voltage as the reverse bias voltage, and the externally-defined DC voltage may be adjustable. In this case, a digital-to-analog converter may be used as the reverse bias voltage source 250, and the reverse bias voltage may be defined by an externally-provided digital control signal. An analog control signal may alternatively be provided to define the reverse bias voltage generated by an analog reverse bias voltage source.

The precision of the sampling performed by the sampling device 200 depends in part on the symmetry between the waveform of the sampling pulses fed to the sampling diode 222 and the waveform of the sampling pulses fed to the sampling diode 223. The sampling pulses fed to the sampling diode 222 are generated by photoconductive switch 204, propagate along the stripline 210 and are applied to the sampling diode 222 through the hold capacitor 254. The sampling pulses fed to the sampling diode 223 are generated by photoconductive switch 205, propagate along the stripline 211 and are applied to the sampling diode 223 through the hold capacitor 255. To achieve symmetry, the portion of the circuit extending from the positive and negative output terminals of the DC generator 202 to the sampling diodes 222 and 223 is configured as a balanced circuit. For example, symmetry is promoted by the photoconductive switch 204 and the stripline 210 having substantially the same electrical characteristics as the photoconductive switch 205 and the stripline 211, respectively, and the reverse bias input line 252 having the same characteristics as the reverse bias input line 253. An integrated circuit with the desired characteristics can be made by using a simple balanced slotline or coplanar stripline for the lines 210, 211; 252, 253 and 261 (262, 266 and 267).

The DC generator 202 typically generates the DC sampling voltage in the range from the turn-on voltage to the breakdown voltage of the terminated diode bridge 220. Typically, this voltage is in the range from about 5 V to about 50 V. The DC sampling voltage output by the DC generator determines the amplitude of the sampling pulses. In determining the output voltage of the DC generator, factors including the desired sampling efficiency and the breakdown voltage of the photoconductive switches 204 and 205 are taken into consideration. In one example, the output voltage was 10 V.

As noted above, the DC generator 202 may be configured to provide an adjustable output voltage to enable the amplitude of the sampling pulses generated by the photoconductive switching element 108 to be adjusted. FIG. 4A shows the DC generator 202 controlled by the controller 270 in response to the digital or analog control voltage AMP received via the amplitude control input 126. For example, the controller or the DC generator may include a digital-to-analog converter that operates in response to a digital amplitude control signal AMP received via the amplitude control input 126. Furthermore, when the sampling device 200 is not being used to sample the signal-under-test, the deactivation control signal DEACT can be received via the deactivation input 128 to set the DC generator to a non-operational state to reduce power consumption.

When the DC generator 202 is configured to provide an adjustable output voltage, the reverse bias voltage generator 250 may also be configured to provide an adjustable output voltage and the control signals fed to the DC generator and the reverse bias voltage generator may be linked. Linking the control signals enables the reverse bias voltage generator to maintain the relationship between the sampling threshold and the tailing threshold regardless of the amplitude of the sampling pulses.

FIG. 4A shows a floating, i.e., non-grounded, voltage source as the DC generator 202. However, the DC generator may be composed of the two DC generators 216 and 217, as shown in FIG. 4B. The DC generators 216 and 217 are connected in series with the connection point between them grounded. Using two DC generators enables the DC sampling voltage applied to the photoconductive switching element 108 to be referenced to the same potential as the threshold sampling circuit 110.

The DC generators 216 and 217 are normally set to generate equal output voltages. Alternatively, the DC generators may be set to generate different output voltages to compensate for differences in the electrical characteristics of the sampling diodes and/or the photoconductive switches.

FIG. 4A shows a floating, i.e., non-grounded, voltage source as the reverse bias voltage source 250. However, the reverse bias voltage source 250 may include the reverse bias voltage sources 218 and 219, as shown in FIG. 4C. The reverse bias voltage sources 218 and 219 are connected in series with the connection point between them grounded. Using two reverse bias voltage sources enables the reverse bias voltage applied to the threshold sampling circuit 110 to be referenced to the same potential as the threshold sampling circuit.

The reverse bias voltage sources 218 and 219 are normally set to generate equal output voltages. Alternatively, the two reverse bias voltage sources may be set to generate different output voltages to compensate for differences in the electrical characteristics of the sampling diodes and/or the photoconductive switches.

When the sampling circuit 200 is fabricated in the same substrate as another electrical circuit, or is contained in the same package, using two non-floating voltage sources as either or both of the DC generator 202 and the reverse bias voltage source 250 is advantageous because the non-floating voltage sources and the other electrical circuit can be powered by common power supplies.

The photoconductive switches 204 and 205 may include a pair of electrodes located on the major surface of a layer of low-temperature grown (LT) gallium arsenide (GaAs) grown on a GaAs substrate. The electrodes are separated from one another by a narrow gap, and may be interdigitated. Illumination of the surface of the substrate exposed by the gap between the electrodes provides electrical conduction between the electrodes.

Low-temperature GaAs is typically formed by epitaxial growth at a low substrate temperature, e.g., a substrate temperature of about 200° C. Low-temperature GaAs is substantially a mono-crystalline material, but has many more defects in its crystal structure than the same material grown at a conventional growth temperature. An example of a photoconductive switch incorporating a layer of LT-GaAs is described in U.S. Pat. Nos. 5,332,918 and 5,844,288 and published International patent application no. WO89-07833.

The laser 104 generates the optical pulses 230 that control the photoconductive switches 204 and 205. In the example shown, the optical pulses have a full width half maximum duration of about 0.1 ps. The laser 104 can be a mode-locked laser or another type of light source capable of generating sub-picosecond optical pulses at a wavelength in the wavelength range in which the LT GaAs of the photoconductive switches has a high absorption coefficient. The photoconductive switches and the laser are arranged so that the optical pulses generated by the laser illuminate the photoconductive switches substantially simultaneously.

The sampling device 200 may additionally include a synchronizing circuit (not shown) that causes the laser 104 to generate the optical pulses 230 synchronized to the signal-under-test. Alternatively, the laser may generate the optical pulses asynchronously relative to the signal-under-test. Also, the laser may be deactivated to reduce power consumption when the sampling device 200 is not being used to sample the signal-under-test. This may be done in addition to deactivating the DC sampling voltage source 106 and the reverse bias voltage source 250. Alternatively, a similar reduction in power consumption may be achieved by deactivating the laser instead of the DC sampling voltage source and the reverse bias voltage source. Deactivating the laser sets the photoconductive switching element 208 to a high-impedance state that minimizes the current drawn from the DC sampling voltage source 106. Moreover, only the reverse leakage current of the sampling diodes 222 and 223 is drawn from the reverse-bias voltage source 250.

Figure 5:
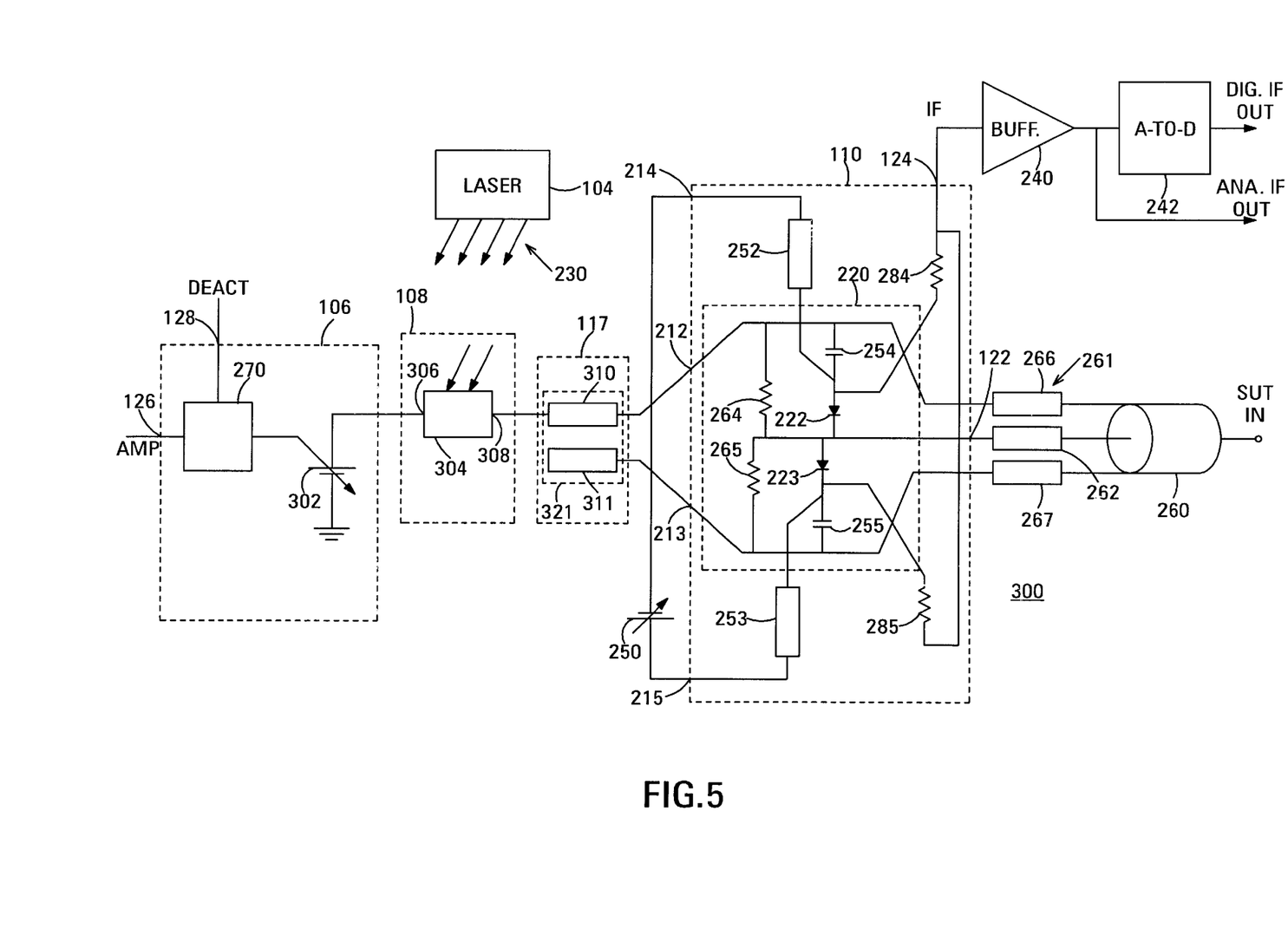
FIG. 5 is a simplified circuit diagram of a second embodiment of a sampling device according to the invention.

FIG. 5 is a simplified circuit diagram of a second embodiment 300 of a sampling device according to the invention. In this embodiment, the photoconductive switching element is composed of no more than one photoconductive switch. The sampling device 300 has a lower manufacturing cost than the sampling device 200 shown in FIG. 4A since it has a lower parts count and alignment between the laser and a single photoconductive switch is simpler. Elements of the sampling device 300 that correspond to elements of the sampling device 200 are indicated by the same reference numerals and will not be described again here.

In the sampling device 300, the DC sampling voltage source 106 is composed of the DC generator 302. The positive output terminal of the DC generator is connected to the input terminal 306 of the photoconductive switch 304, and the negative output terminal is connected to a ground.

The output terminal 308 of the photoconductive switch is connected to one end of the stripline 310. The lines 310 and 311 run parallel and adjacent one another to form the coplanar line 321. The sampling pulse input 212 of the threshold sampling circuit 110 is connected to the other end of the stripline 310. The sampling pulse input 213 of the threshold sampling circuit 110 is connected to the end of the stripline 311 corresponding to the end of the stripline 310 to which the sampling pulse input 212 is connected. The other end of the stripline 311 is open.

The length of the coplanar line 321 is sufficient for the sampling pulses propagating through the stripline 310 to generate sampling pulses of the opposite polarity in the stripline 311. As a result, pair of balanced sampling pulses are output by the coplanar line 321 to the sampling pulse inputs 212 and 213 of the threshold sampling circuit 110.

Figure 6:
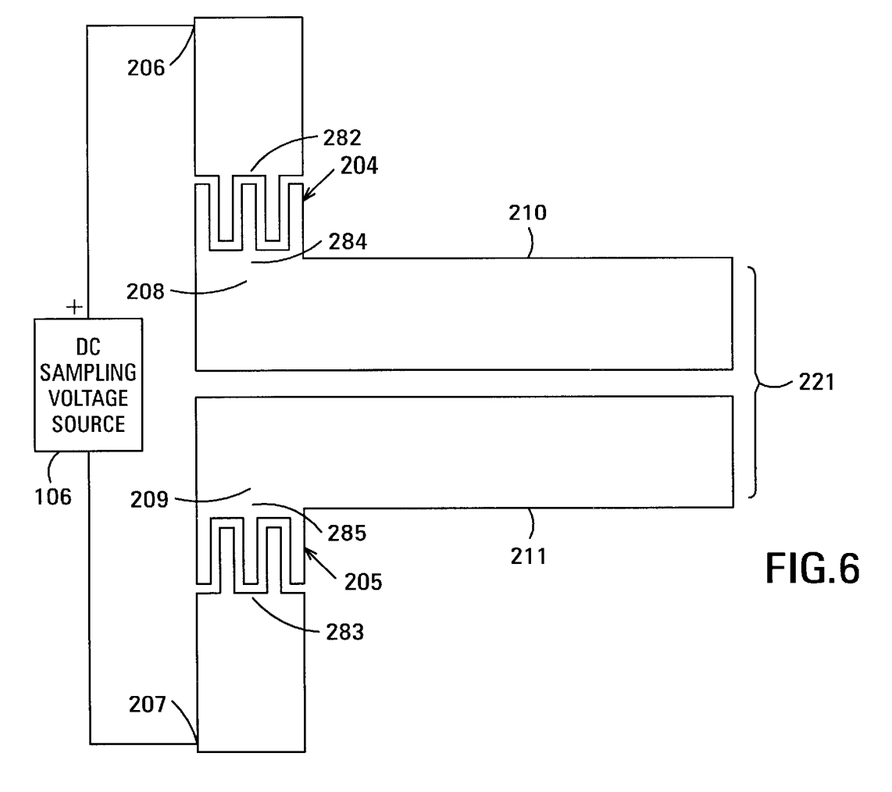
FIG. 6 shows an example of the electrode and stripline pattern of the portion that generates the sampling pulses in the embodiment of the sampling device shown in FIG. 4A.

FIG. 6 shows an example of the electrode pattern of the portion of the sampling device 200 shown in FIG. 3A that generates the sampling pulses. The positive output terminal of the DC sampling voltage source 106 is connected to the input terminal 206 of the photoconductive switch 204. The input terminal 206 is connected to the first electrode 282 of the photoconductive switch 204. The negative output terminal the DC sampling voltage source is connected the input terminal 207 of the photoconductive switch 205. The input terminal 207 is connected to the first electrode 283 of the photoconductive switch 205.

The second electrode 284 of the photoconductive switch 204 provides the output terminal 208 of the photoconductive switch 204. The second electrode 284 extends to form to the stripline 210. The second electrode 285 of the photoconductive switch 205 provides the output terminal 209 of the photoconductive switch 205. The second electrode 285 extends to form the stripline 211, which runs adjacent and substantially parallel to the stripline 210. The striplines 210 and 211 collectively constitute the coplanar line 221 that transmits balanced sampling pulses to the sampling pulse inputs 212 and 213 of the threshold sampling circuit 110 (FIG. 4A).

Figure 7:
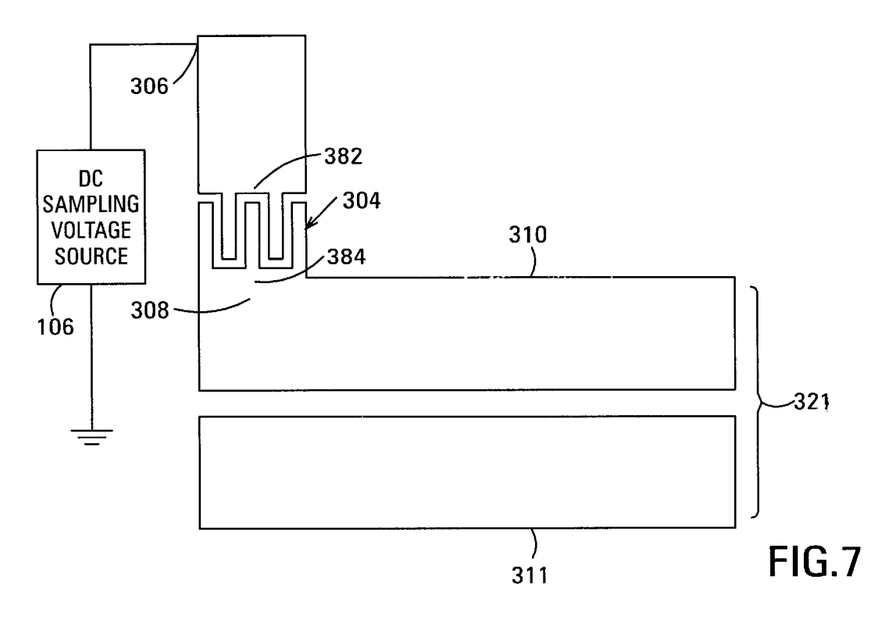
FIG. 7 shows an example of the electrode and stripline pattern of the portion that generates the sampling pulses in the embodiment of the sampling device shown in FIG. 5.

FIG. 7 shows an example of an electrode pattern of the portion of the sampling circuit 300 shown in FIG. 5 that generates the sampling pulses. The positive output terminal of the DC sampling voltage source 106 is connected to the input terminal 306 of the photoconductive switch 304. The input terminal 306 is connected to the first electrode 382 of the photoconductive switch 304. The negative output terminal of the DC sampling voltage source is grounded.

The second electrode 384 of the photoconductive switch 304 provides the output terminal 308 of the photoconductive switch 304. The second electrode 384 extends to form to the stripline 310. The stripline 311 is located adjacent, and runs parallel to, the stripline 310. The striplines 310 and 311 collectively constitute the coplanar line 321. The length of the coplanar line 321 is sufficient for the sampling pulses generated by the photoconductive switch 304 and propagating through the stripline 310 generate sampling pulses of the opposite polarity in the stripline 311. As a result, the coplanar line 321 delivers pair of balanced sampling pulses to the sampling pulse inputs 212 and 213 of the threshold sampling circuit 110 (FIG. 5).

In the above examples, the terminated diode bridge 220 that performs the sampling is shown as a two-diode bridge. However, four-diode bridge are known in the art and can alternatively be used. As long as it receives sufficiently large sampling pulses, a four-diode bridge will reduce the leakage of the sampling pulses or of the signal-under-test to the IF output.

Elements that are described in this disclosure as striplines may be replaced by other suitable transmission lines and the term stripline will be understood to encompass such alternatives.

Elements described in this disclosure as being connected to opposite ends of a stripline will be regarded as being so connected even when they are connected to the stripline at different points other than the ends.

Although this disclosure describes illustrative embodiments of the invention in detail, it is to be understood that the invention is not limited to the precise embodiments described, and that various modifications may be practiced within the scope of the invention defined by the appended claims.

We claim:

1. A sampling element, comprising:
   a DC sampling voltage source;
   a threshold sampling circuit including a signal-under-test input, a sampling pulse input and an IF signal output, the threshold sampling circuit having a sampling threshold with respect to sampling pulses received at the sampling pulse input; and
   a photoconductive switching element connected between the DC sampling voltage source and the sampling pulse input.

2. The sampling element of claim 1, additionally comprising a DC reverse bias voltage source connected to the threshold sampling circuit and operating to define, at least in part, the sampling threshold.

3. The sampling element of claim 2, in which:
   the photoconductive switching element has a dynamic switching characteristic that exhibits a tailing response below a tailing threshold; and
   the sampling threshold of the threshold sampling circuit is greater than the tailing threshold.

4. The sampling element of claim 3, in which:
   the threshold sampling circuit includes a threshold switching element having an intrinsic threshold voltage; and
   the intrinsic threshold voltage of the threshold switching element and the DC reverse bias voltage source collectively set the sampling threshold of the threshold sampling circuit to a value greater than the tailing threshold.

5. The sampling element of claim 3, in which the DC reverse bias voltage operates to set the sampling threshold of the threshold sampling circuit to a value greater than the tailing threshold.

6. The sampling element of claim 3, additionally comprising:
   a controller connected to the DC sampling voltage source and operating to control the sampling voltage; and
   a controller connected to the reverse bias voltage source and operating to control the reverse bias voltage to set the sampling threshold of the threshold sampling circuit to a value greater than the tailing threshold.

7. The sampling element of claim 1, in which:
   the photoconductive switching element has a dynamic switching characteristic that exhibits a tailing response below a tailing threshold; and
   the sampling threshold of the threshold sampling circuit is greater than the tailing threshold.

8. The sampling element of claim 7, in which the threshold sampling circuit includes a threshold switching element having an intrinsic threshold voltage that defines the sampling threshold of the threshold sampling circuit, the intrinsic threshold voltage being greater than the tailing threshold.

9. The sampling element of claim 8, additionally comprising a DC reverse bias voltage source connected to the threshold sampling circuit and operating to increase the sampling threshold of the threshold sampling circuit to a value greater than the intrinsic threshold voltage of the threshold switching element.

10. The sampling element of claim 1, additionally comprising a controller connected to the DC sampling voltage source and operating to control the sampling voltage.

11. The sampling element of claim 1, in which:
    the sampling pulse input includes a first sampling pulse input and a second sampling pulse input;
    the DC sampling voltage source includes a first output terminal and a second output terminal; and
    the photoconductive switching element includes:
       a first photoconductive switch connected between the first output terminal and the first sampling pulse input, and
       a second photoconductive switch connected between the second output terminal and the second sampling pulse input.

12. The sampling element of claim 11, in which the DC sampling voltage source includes a first DC generator and a second DC generator each having a positive output terminal and a negative output terminal, the positive and negative output terminals of the first DC generator being respectively connected to the first output terminal and to ground, the positive and negative output terminals of the second DC generator being respectively connected to ground and to the second output terminal.

13. The sampling element of claim 1, in which:
    the sampling pulse input includes a first sampling pulse input and a second sampling pulse input;
    the photoconductive switching element includes no more than one photoconductive switch, the photoconductive switch comprising an input connected to the DC sampling voltage source, and an output; and
    the sampling element additionally comprises a first stripline and a second stripline disposed adjacent and substantially parallel to one another, in which:
       a first portion of the first stripline is connected to the output of the photoconductive switch,
       a second portion of the first stripline, different from the first portion, is connected to the first sampling pulse input, and
       a portion of the second stripline is connected to the second sampling pulse input.

14. A sampling device, comprising:
    a DC sampling voltage source;
    a threshold sampling circuit including a signal-under-test input, a sampling pulse input and an IF signal output, the threshold sampling circuit having a sampling threshold with respect to sampling pulses received at the sampling pulse input;
    a photoconductive switching element connected between the DC sampling voltage source and the sampling pulse input; and
    a light source operable to generate optical pulses and arranged to illuminate the photoconductive switching element with the optical pulses.

15. The sampling device of claim 14, additionally comprising a DC reverse bias voltage source connected to the threshold sampling circuit and operating to define, at least in part, the sampling threshold.

16. The sampling device of claim 15, in which:
the photoconductive switching element has a dynamic switching characteristic that exhibits a tailing response below a tailing threshold; and
the sampling threshold of the threshold sampling circuit is greater than the tailing threshold.

17. The sampling device of claim 16, in which:
the threshold sampling circuit includes a threshold switching element having an intrinsic threshold voltage; and
the intrinsic threshold voltage of the threshold switching element and the DC reverse bias voltage source collectively set the sampling threshold of the threshold sampling circuit to a value greater than the tailing threshold.

18. The sampling device of claim 16, in which the DC reverse bias voltage source operates to set the sampling threshold of the threshold sampling circuit to a value greater than the tailing threshold.

19. The sampling device of claim 14, in which:
the photoconductive switching element has a dynamic switching characteristic that exhibits a tailing response below a tailing threshold; and
the sampling threshold of the threshold sampling circuit is greater than the tailing threshold.

20. The sampling device of claim 19, in which the threshold sampling circuit includes a threshold switching element having an intrinsic threshold voltage that defines the sampling threshold of the threshold sampling circuit, the intrinsic threshold voltage being greater than the tailing threshold.

21. The sampling device of claim 20, additionally comprising a DC reverse bias voltage source connected to the threshold sampling circuit and operating to increase the sampling threshold of the threshold sampling circuit to a value greater than the intrinsic threshold voltage of the threshold switching element.

22. The sampling device of claim 14, in which:
the sampling pulse input includes a first sampling pulse input and a second sampling pulse input;
the DC sampling voltage source includes a first output terminal and a second output terminal; and
the photoconductive switching element includes:
a first photoconductive switch connected between the first output terminal and the first sampling pulse input, and
a second photoconductive switch connected between the second output terminal and the second sampling pulse input.

23. The sampling device of claim 14, in which:
the sampling pulse input includes a first sampling pulse input and a second sampling pulse input;
the photoconductive switching element includes no more than one photoconductive switch, the photoconductive switch comprising an input connected to the DC sampling voltage source, and an output; and
the sampling element additionally comprises a first stripline and a second stripline disposed adjacent and substantially parallel to one another, in which:
a first portion of the first stripline is connected to the output of the photoconductive switch,
a second portion of the first stripline, different from the first portion, is connected to the first sampling pulse input, and
a portion of the second stripline is connected to the second sampling pulse input.

* * * * *